(12) United States Patent
Peckerar et al.

(10) Patent No.: US 6,309,934 B1
(45) Date of Patent: Oct. 30, 2001

(54) FULLY SELF-ALIGNED HIGH SPEED LOW POWER MOSFET FABRICATION

(75) Inventors: Marty Peckerar, Silver Spring, MD (US); Weizhong Wang, Sunnyvale, CA (US); John Melngailis, Chevy Chase, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/508,925
(22) PCT Filed: Aug. 8, 1997
(86) PCT No.: PCT/US97/13899
§ 371 Date: Jan. 6, 2000
§ 102(e) Date: Jan. 6, 2000
(87) PCT Pub. No.: WO98/06130
PCT Pub. Date: Feb. 12, 1998

Related U.S. Application Data
(60) Provisional application No. 60/023,731, filed on Aug. 8, 1996.

(51) Int. Cl.$^7$ .................................................. H01L 21/336
(52) U.S. Cl. ........................... 438/299; 438/289; 438/301; 438/4
(58) Field of Search .................................... 438/299, 289, 438/301, 4

(56) References Cited

U.S. PATENT DOCUMENTS

| | | | |
|---|---|---|---|
| 3,660,735 | * | 5/1972 | McDougall ...................... 317/235 R |
| 3,858,304 | * | 1/1975 | Ieedy et al. ............................ 29/578 |

* cited by examiner

Primary Examiner—Tuan H. Nguyen
Assistant Examiner—Thanh Nguyen
(74) Attorney, Agent, or Firm—John J. Karasek; Sally A. Ferrett

(57) ABSTRACT

Channel doping and gate lithography are simulatneously performed by focusing an ion beam into the wafer through a positive or negative photoresist that is sensitive to the ion beam. Additional fabrication is then performed to provide a gate that is self-aligned with the doped channel.

2 Claims, 6 Drawing Sheets

FIG. 6a p+ DOPING PROFILE FROM SUPREM SIMULATION

FIG. 6b n+ DOPING PROFILE FROM SUPREM SIMULATION

FULLY SELF-ALIGNED HIGH SPEED LOW POWER MOSFET FABRICATION

This application claim benefit to provisional application 60/023,731 Aug. 8, 1996.

BACKGROUND OF THE INVENTION

1. Field of the Invention

The present invention relates generally to metal-oxide-semiconductor field effect transistors (MOSFETs) and more specifically to self-aligned MOSFETs.

2. Description of the Background Art

The primary challenge of VLSI is the integration of an ever increasing number of devices with high yield and reliability. However, as device dimensions are shrank into the deep-sub-micrometer regime, the characteristics of a conventional MOSFET approach that of a resistor. This difficulty is traditionally solved by increasing the height of barrier for electrons in channel region through increased channel doping, causing undesirable large junction capacitance. At the same time reliability constraints have led to reduction in the power supply voltage. The combination of high channel doping and capacitance, increased threshold voltage, and reduced supply voltage, impose severe trade off between stand-by power and circuit speed.

In order to achieve high speed and low power consumption, the most popular solution is SOI (Silicon on Insulator) structure, which has been widely studied. In a SOI structure, the junction capacitance of the device is reduced by incorporating a thick buried oxide directly beneath the channel. Additionally, the use of a thin silicon layer relaxes the need to highly dope the channel in order to prevent punch-through. That is, the rapid vertical drop of the electric field, together with the large lateral potential curvature, creates the potential barrier preventing electron flow from the source. Thus, the vertical structure is used to control horizontal leakage.

However, SOI structures are not entirely satisfactory for a number of reasons. For example, the silicon film thickness in SOI structures having 0.1-um gate lengths is only about 500 Å or even less. The precise thickness control is not easy to be achieved by current technology. On top of that, the substrates of fully depleted SOI MOSFETs tend to float electrically, because it is difficult to have good body contact to the thin silicon film. However, as the lateral electric field increases impact-ionization-generated holes tend to become trapped within the floating body, leading to unpredictable subthreshold behavior.

Yan[1] proposed an innovative, but realistic device structures in bulk Si, which can mimic the SOI philosophy, providing well-behaved devices in the deep-sub-micrometer regime at room temperature. Based on above proposed structures, Lee[2] fabricated a CMOS frequency divider with frequency of 13.6 GHz at 28 mW[3] and 3 GHz Phase Locked Loops at 25 mW. These results demonstrate that bulk CMOS with modulated channel doping has become a contender to GaAs and Bipolar Si even for high speed circuit application.

The above record speed devices are fabricated by e-beam lithography and broad beam implantation for channel doping and separated processing for gate fabrication. Since the doping profile can not be well controlled by the e-beam lithography and broad beam ion implantation, the effects from different vertical and lateral doping profiles, which are the key issues of this research, have not been studied. The problem of the misalignment between channel doping and the gate position due to separated processing steps for channel doping and gate fabrication will affect the device characteristic severely too. Although the record CMOS devices speeds have been achieved, the fabrication technology is not well optimized.

Figure 1A:
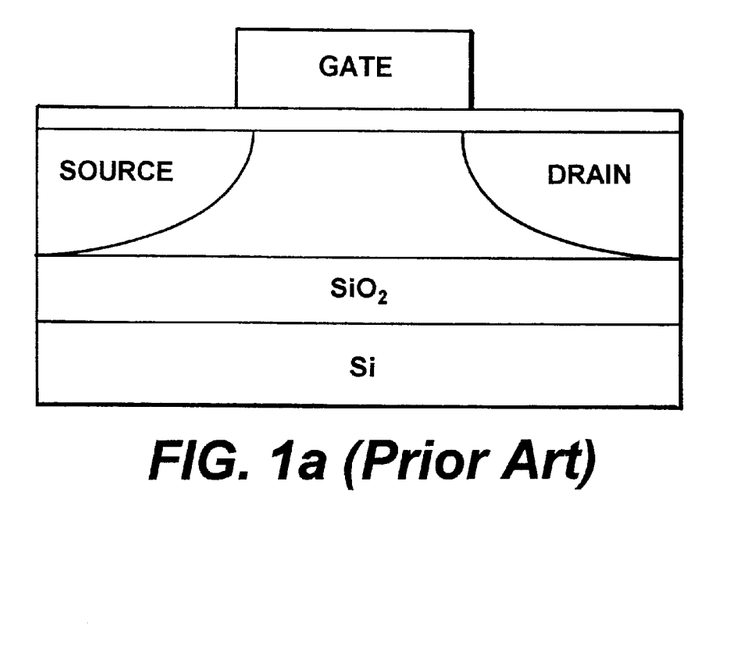
FIG. 1a shows a MOSFET design.

In conventional MOSFET (FIG. 1a), when the gate length penetrates into deep-sub-micrometer regime, and the substrate doping is kept at low level, the depletion regimes of source and drain junctions will touch to each other and the MOSFET approaches a resistor. One solution is to increase the substrate doping. Then the threshold voltage and junction capacitance are increased. This is the trade off between standby power and circuit speed. Ideal solution is to keep low junction capacitance and increase the threshold voltage. SOI structure is a solution to get that point.

The potential distribution in the active Si film $\Psi(x,y)$ is governed by Poisson's equation $$\frac{d^2\Psi}{dx^2} + \frac{d^2\Psi}{dy^2} = \frac{qN_A}{\varepsilon_{Si}}$$

where $0 \leq x \leq L_{eff}$ $L_{eff}$ is the effective channel length.
$0 \leq y \leq t_{si}$ $t_{si}$ is the thickness of the active silicon layer.

To simplify the 2D Poisson's equation to 1-D equation, we assume that the potential distribution in vertical direction is a simple parabolic function.

$$\Psi(x,y) = c_0(x) + c_1(x)y + c_2(x)y^2$$

we are further assuming four boundary conditions in vertical direction: potential and electric field on the top and bottom interface of active low doping Si layer. However, since the potential at the bottom interface of Si film essentially floats, we can not use that as a boundary condition. We also assume that the electric field on the bottom interface is zero due to existing oxide layer. Since there is no charge in the oxide layer, the electric field within the oxide layer would be constant. The potential drop across the oxide layer is the electric field multiplied by oxide layer thickness. Since the potential drop is small, we can assume the electrical field is zero, assuming oxide layer is thick enough. Now, we have three boundary conditions.

$$(I)\Psi(x,0) = \Psi_f(x) = c_0(x)$$

where $\Psi_f$ is the potential on the top surface of the Si layer $$\left.\frac{d\Psi(x,y)}{dy}\right|_{y=0} = \frac{\varepsilon_{ox}}{\varepsilon_{Si}} \frac{\Psi_f(x) - \Psi_{gs}}{t_{ox}} = c_1(x) \quad (2)$$

$$\left.\frac{d\Psi(x,y)}{dy}\right|_{y=t_{Si}} = \frac{\varepsilon_{ox}}{\varepsilon_{Si}} \frac{\Psi_{bs} - \Psi_b(x)}{t_{box}} = c_1(x) + 2t_{Si}c_2(x) \cong 0 \quad (3)$$

Then we obtain $\Psi(x,0)$ as the following expression $$\phi(x) = \Psi_f(x) - \Psi_{gs} + \frac{qN}{\varepsilon_S}$$

where: $\lambda = \sqrt{\frac{\varepsilon_{Si}}{\varepsilon_{ox}} t_{Si} t_{ox}}$ -continued $$\frac{d^2\phi}{dx^2} - \frac{\phi(x)}{\lambda^2} = 0$$

By using two boundary condition in x direction $$\phi(0) = V_{bi} - \Psi_{gs} + \frac{qN_A}{\varepsilon_{Si}}\lambda^2 = \phi_s$$

We obtain the potential distribution $$\phi(x) = \frac{\phi_s\left[e^{(L_{eff}-x)/\lambda} - e^{(x-L_{eff})/\lambda}\right] + \phi_d\left[e^{x/\lambda} - e^{-x/\lambda}\right]}{e^{L_{eff}/\lambda} - e^{-L_{eff}/\lambda}}$$

$$\phi(L_{eff}) = V_{ds} + V_{bi} - \Psi_{gs} + \frac{qN_A}{\varepsilon_{Si}}\lambda^2 = \phi_d$$

To study the punch through behavior, we need to find the minimum potential in the channel $$\left.\frac{d\phi}{dx}\right|_{x=x_{min}} = 0 \rightarrow \phi_s\left[e^{(L_{eff}-x_{min})/\lambda} + e^{(x_{min}-L_{eff})/\lambda}\right] = \phi_d\left[e^{x_{min}/\lambda} + e^{-x_{min}/\lambda}\right]$$

assuming $$e^{(L_{eff}/\lambda)} \gg 1$$

$$x_{min} = \frac{1}{2}L_{eff} + \frac{1}{2}\lambda\ln\left(\frac{\phi_s}{\phi_d}\right)$$

So, we have the results as:

$$\phi_{min} = 2\sqrt{\phi_s\phi_d}e^{(-L_{eff}/2\lambda)}$$

Figure 1B:
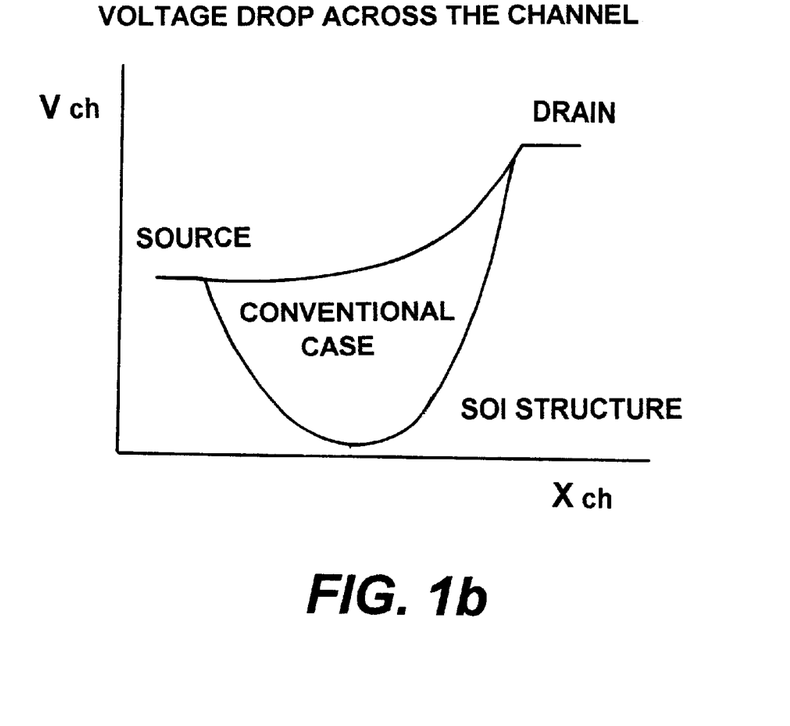
FIG. 1b shows the characteristic voltage drop across a prior art MOSFET.

According to simulation (FIG. 1b), $L_{eff}/\lambda=5-10$ is generally good enough to produce reasonable subthreshold behavior.

So, we can control the minimum potential in the channel regime by changing the value of $\lambda$. Consequently, we can control the punch through effect by adjusting the vertical doping profile. The SOI structure is good for high-speed (low drain capacitance) and low power consumption (barrier for electron flow from source to drain)

Vertical Doping Engineering

Although SOI structure can improve the devices performance. There are some physical and technical restrictions on it. When the device penetrates into deep submicron, the active silicon layer is very thin.

High quality wafer fabrication is difficult and costly. Although SOI wafer substrates may be formed by several methods, the two most acceptable approaches are the high temperature bonding of two silicon epi-wafers followed by an etch-back of one of the wafers (bonded), or through the implantation of an epi-wafer with oxygen atoms, followed by a heat cycle to form the oxide and also anneal the wafer (SIMOX). The key issues for either SOI technology in commodity applications is wafer supply with acceptable quality at affordable price. Neither bonded or SIMOX materials are nearly mature enough for high production rates. Both approaches require relatively lengthy processing times, are not readily amenable to true batch processing, and are unproven in application to large wafer diameters. Bonded wafers require a more complicated manufacturing process. Wafers may be bonded in a batch furnace, but wafer thinning is single wafer processing, requiring iteration between surface thickness inspections and material removal. There are issues regarding the manufacture ability and scalably of this single wafer process. The completeness and integrity of the bond is an issue for bonded. On the other hand, a few wafers (less than 25) may be implanted simultaneously in an oxygen implanter. For VLSI processes, the thin silicon must be highly controlled to thicknesses under 100 nm and very small spatial variations in uniformity. The quality of buried oxide and the thin silicon region are a concern for SIMOX wafers.

In physics part, the substrates of fully depleted SOI MOSFETs will float electrically, because it is difficult to have good body contact to the thin silicon film. If the gate is floating, the subthreshold behavior is going to be unpredictable.

Figure 1C:
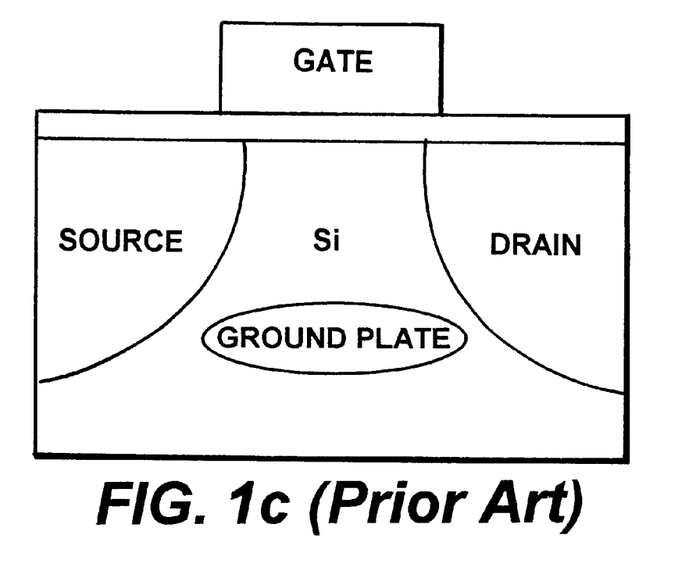
FIG. 1c shows a MOSFET design using a ground plate.

So ideal structure should be able to mimic the SOI philosophy in bulk Si. Yan [1] proposed a concept of vertical doping engineering, which can be realized in bulk Si, to obtain good subthreshold characteristics without large junction capacitance. The structure of the vertical doping engineering is to keep low doping level in channel region and substrate, have a heavily local doping region just beneath the gate, which will create electron barrier to suppress the sub-threshold current (see FIG. 1c).

Current Processing Technology

In current technology, only the dimension of the gate was scaled while other dimension of the gate relaxed to be 0.5–0.75 $\mu$m. Thus only the narrow gate were fabricated by special technique while wide gates and all other level were defined by optical lithography. So, the important parts are the channel doping and the gate fabrication.

(a) Channel doping

Bell lab used e-beam lithography and broad beam implantation for the channel doping. Since the channel length is 100 nm, advanced lithography methods such as ion beam lithography, e-beam lithography or x-ray lithography etc. need to be used.

To control short channel effects, the laterally confined channel implant and punch-through suppression implant of the n or p device was performed by the same masking step, using $BF_2$ ($1\times10^{13}/cm^2$ at 90 keV) and boron ($4\times10^{12}/cm^2$ at 45 keV) for NMOS or arsenic ($1\times10^{13}/cm^2$ at 100 keV) and phosphors ($4\times10^{12}/cm^2$ at 120 keV) for the PMOS.

(b) Gate fabrication (1) Fabrication by e-beam lithography

Bell lab. used 100 pA e-beam current on 800 Å SAL603 resist. The key processing step for SAL603 resist is shown to be a thermal activation after exposure to cause long chain macromolecule formation, which is insoluble to the developer. Also, the mix and match of e-beam and optical lithography used in this technique development is desired. In order to transfer lithography pattern to gate pattern, lithography step is followed by nitride etch and polysilicon gate etch.

(2) Fabrication by g-line exposure technology

In order to increase the yield of the gate fabrication, Jeon[5] conducted g-line exposure, resist narrowing, deep ultraviolet hardening and dry etching of nitride and polysilicon to get the 100 nm gate length. After g-line exposure, the resist features were narrowed from 500 nm down to 100 nm using low power $O_2$ plasma. The narrowed resist features were then hardened by deep UV in order for the photo resist to withstand the subsequent nitride etch using $CHF_3$ reactive ion etching (RIE) The subsequent polysilicon etch was done using two-step $Cl_2$ RIE. The obtained profile of polysilicon is comparable to that obtained using e-beam lithography.

(c) Record Device Speed achieved by proposed structure

| | Gate delay: | |
|---|---|---|
| Toshiba (92) | 0.1 μm/CMOS/Bulk | 2.5V 27.7 ps |
| Berkeley (92) | 0.2 μm/NMOS/SOI | 1.5V 13.5 ps |
| IBM (93) | 0.15 μm/CMOS/Bulk | 1.8V 25.0 ps |
| IBM (93) | 0.1 μm/CMOS/SOI | 1.8V 20.0 ps |
| IBM (93) | 0.08 μm/NMOS/Bulk | 1.5V 13.0 ps |
| Bell (93) | 0.1 μm/CMOS/Bulk | 2.5V 11.8 ps |
| | | 2.0V 12.7 ps |
| | Frequency divider | |
| U. of Tokyo (93) | 0.1 μm/SOI | 2V 2.6 GHz |
| Bell (95) | 0.1 μm/CMOS | 1.2V 5 GHz |
| | | 2V 10 GHz |

(d) Problems with the Current Technology

The current 100 nm channel doping technology is the combination of e-beam lithography and broad beam implantation. It is difficult to control the doping profile due to mask wall scattering. Since the profile of doping is the key point of the proposed structure. It is difficult to improve the device characteristic by this channel doping technology.

Although Bell lab. developed two methods for fabrication of 100 nm gate. The yield is low for e-beam lithography. The extra steps for the g-line exposure methods will affect the device quality and yield.

More important, since the channel doping and gate fabrication are separated procedure, the alignment of the gate position and the channel doping is not easy, especially for 100 nm channel length. The misalignment will affect the device's performance severely. Once the misalignment happens, the heavily local doping may be placed to the position beneath the source or drain. Consequently, compared with conventional devices, the subthreshold current does not change, but the drain/source capacitance increased a lot, and the speed of the device slow down. So, it is important to develop self-alignment fabrication technology for this kind of devices.

SUMMARY OF THE INVENTION

Accordingly, it is an object of this invention to provide a MOSFET in which the channel is self-aligned with the gate.

It is another object of the present invention to simplify the production of MOSFETs.

It is a further object of the present invention to improve the performance, quality, and production yield of MOSFETs.

These and additional objects of the invention are accomplished by using ion beam lithography to simultaneously substrate to dope a channel in a substrate and expose an ion beam activated photoresist overlying the substrate. A positive or negative photoresist may be used.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIGS. 5a through 5e show a method according to the present invention wherein a positive photoresist is used to make the mask for reactive ion etching.

DESCRIPTION OF THE PREFERRED EMBODIMENTS

Figure 2:
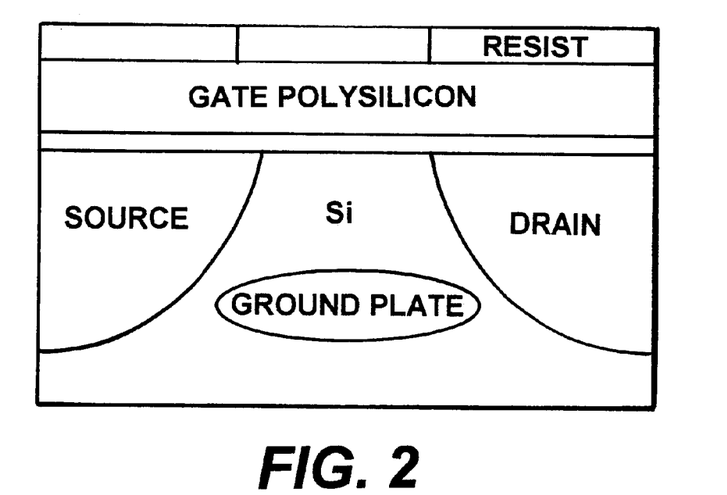
FIG. 2 shows a MOSFET made according to the present invention.
Figure 3A:
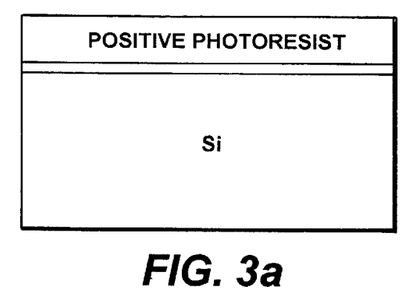
FIGS. 3a through 3d show the fabrication of a MOSFET according to the present invention using a positive photo-resist.
Figure 3B:
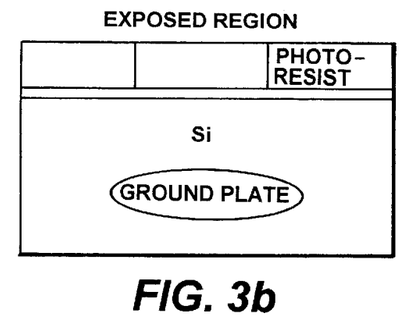
Figure 3C:
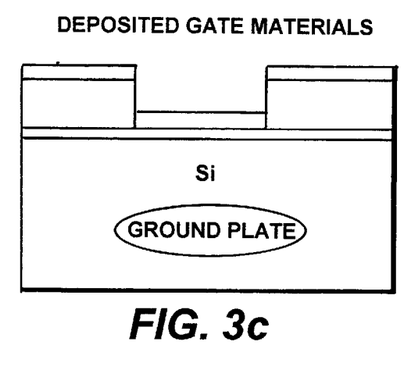
Figure 3D:
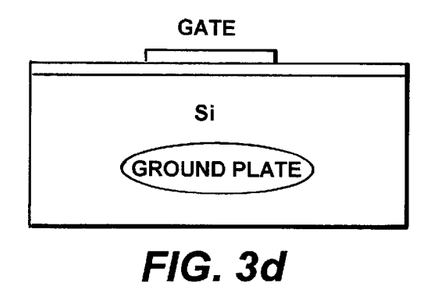
Figure 4A:
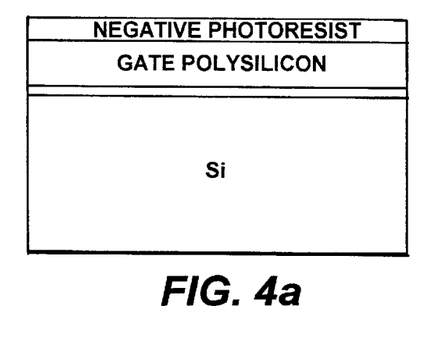
FIGS. 4a through 4d show the fabrication of a MOSFET according to the present invention using a negative photo-resist.
Figure 4B:
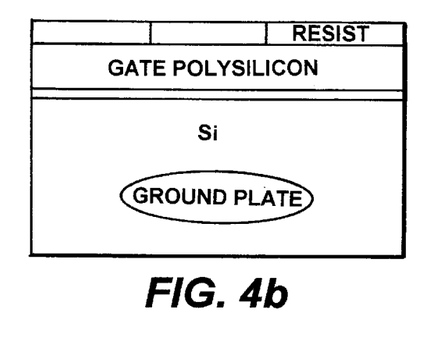
Figure 4C:
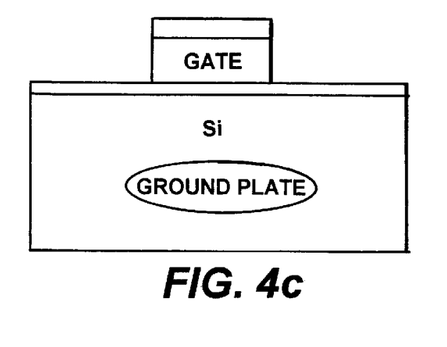
Figure 4D:
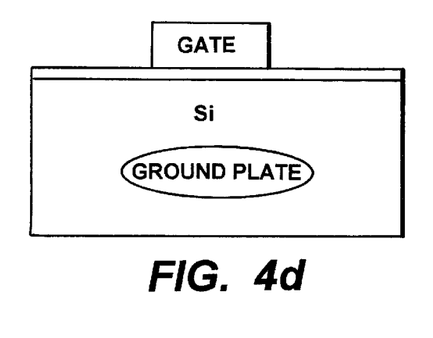
Figure 5A:
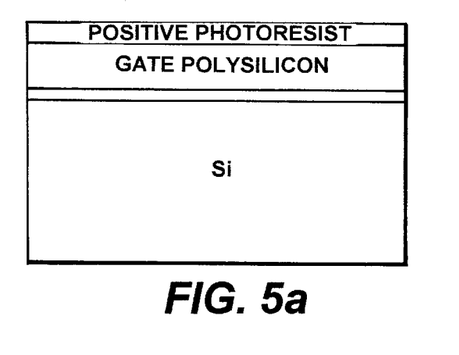
Figure 5B:
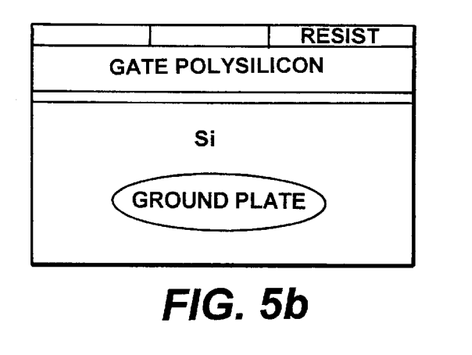
Figure 5C:
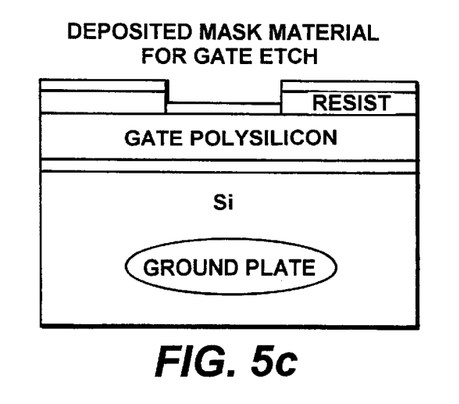
Figure 5D:
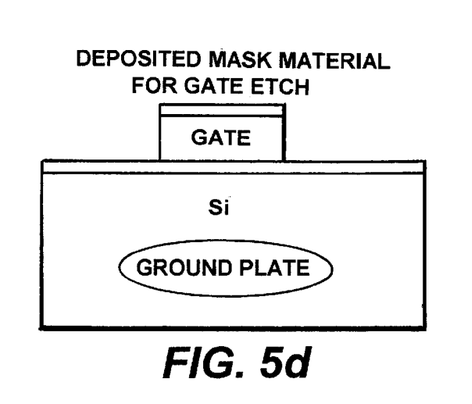

Focused ion beam direct implantation is used to implement the vertical doping engineering structure in channel region to fabricate high speed CMOS devices. The proposed structure is shown in FIG. 2. The advantage of the proposed technology are as followings:

(1) Controllable doping profile in channel regime. It is much easier to control the doping profile by focused ion beam implantation for both lateral and vertical profile.

(2) Direct implantation will have the channel doping and gate lithography done at the same step by the same ion beam. Consequently the self-alignment of the gate position and the channel doping has been achieved. On top of that, the fabrication steps will be reduced and the yield will be increased compared with separated channel doping and gate fabrication step.

Figure 6A:
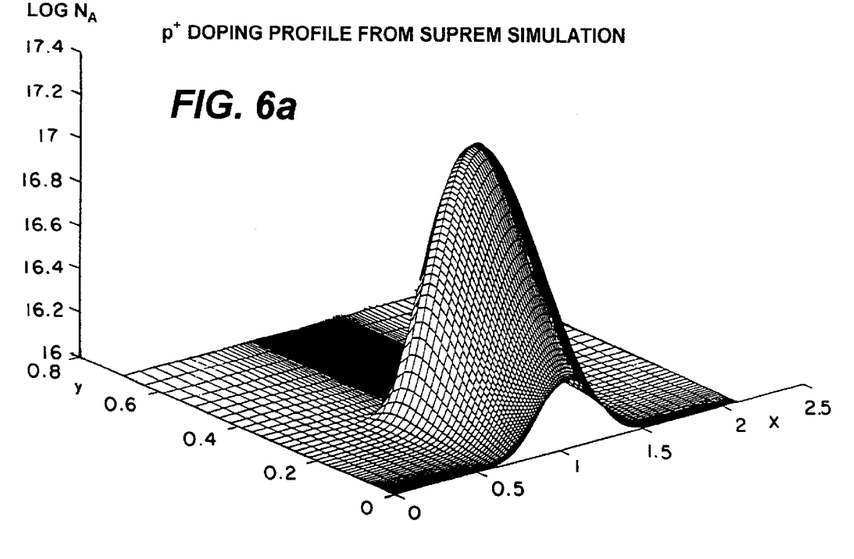
FIGS. 6a and 6b show the results of simulations of the method of the present invention.
Figure 6B:
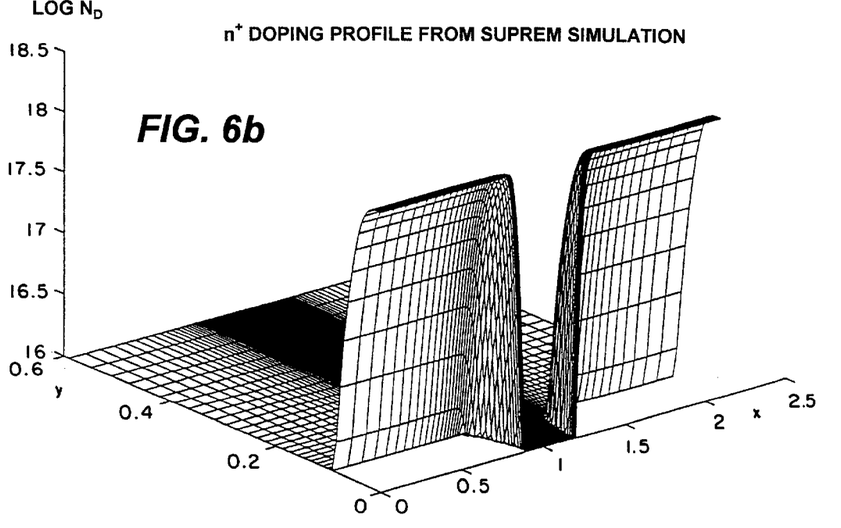

SUPREM simulation (FIGS. 6a and 6b) gives encouraging results. We set the parameters for the SUPREM as the followings: $B^+$ beam energy 160 keV, dose $1 \times 10^{13}/cm^2$. As beam energy 50 keV dose 40 keV, annealing time 45 min at 950° C. the thickness of the photo resist is 100 nm, the thickness of poly-silicon is 200 nm and the thickness of the $SiO_2$ layer is 50 nm.

In order to implement the proposed self-alignment fabrication, there are several ways to do that. It could be done by positive photo-resist and lift-off step or negative photo-resist and reactive ion etching or positive photoresist defined etching mask, and reactive ion etching etc. Regarding to the ion beams, it could be focused ion beam and broad ion beam through mask. Following are the three of detailed principle processing flow for this proposed fabrication technique.

(1) Positive Photo-resist and lift-off.

In this method (FIGS. 3a through 3d), we deposit $SiO_2$ and positive photoresist on the Si wafer. Then ion beam goes through positive photoresist and $SiO_2$ into bulk Si. While the ion beam goes through photoresist, the positive Photoresist gets exposed. By depositing gate materials on top of developed positive photoresist and lift-off, we are going to get a gate directly above the heavily doping region.

(2) Negative Photo-resist and Reactive ion etch.

In this method (FIGS. 4a through 4d), we deposit $SiO_2$, polysilicon (gate materials) and negative photoresist on the Si wafer. While the ion beam goes through photoresist, the negative photoresist get exposed. By using reactive ion etching, we are going to get the gate defined by developed negative photoresist. Again, The gate and the heavily doped region are self-aligned.

(3) Positive Photo-resist to make the mask for reactive ion etch.

In this method (FIGS. 5a through 5e), we deposit $SiO_2$, poly-silicon (gate materials) and positive photoresist on the Si wafer. After the beam going through positive photoresist, the developed photoresist pattern can be used to make metal mask for the reactive ion etch by depositing metal and lift-off. The final gate is etched from polysilicon, which is masked by depositted metal.

The high performance and low power consumption characteristics of vertical doping engineering CMOS structure have been demonstrated by Bell lab. However, the gate and heavily doping region are not self-aligned in current fabrication technology. This invention proposed a new fully self-algned fabrication technique for vertical doping engineering devices. Compared with the current fabrication technique, it also reduces the fabrication steps.

Obviously, many modifications and variations of the present invention are possible in light of the above teachings. It is therefore to be understood that, within the scope of the appended claims, the invention may be practiced otherwise than as specifically described.

Reference (1) Ran-Hong Yan et al. "scaling the Si MOSFET: From Bulk to SOI to Bulk", IEEE Transactions on Electron Devices, Vol 39 No. 7, pp. 1704–1710 July 1992
(1) Ran-Hong Yan et al. "scaling the Si MOSFET: From Bulk to SOI to Bulk ", IEEE Transactions on Electron Devices, Vol 39 No. 7, pp. 1704–1710 July 1992
(2) K. F. Lee et al, "Room Temperature 0.1 $\mu$m CMOS Technology with 11.8 ps Gate Delay" IEDM 93–131
(3) Behzad Razavi et al. "Design of High-Speed, Low-Power Frequency Dividers and Phase-Locked Loops in Deep Submicron CMOS" IEEE Journal of Solid State Circuits, Vol. 30, No. 2 pp. 101–109 February 1995
(4) D. Y. Jeon et al. "Gate technology for 89 GHz vertical doping engineered Si metal-oxide semiconductor field effect transistor" J. Vac. Sci. Technol. B 10(6), Nov/Dec 1992 pp. 2922–2926
(5) D. Y. Jeon et al. "Gate technology for 0.1 $\mu$m Si complementary metal-oxide-semiconductor using g-line exposure and deep ultraviolet hardening", J. Vac. Sci. Technol. B 12(4) pp 2800–2804 Jul/Aug 1994

What is claimed is:

1. A method of forming a metal-oxide-semiconductor field effect transistor having a self-aligned gate, comprising the steps of:

forming a substrate comprising a silicon wafer having, an $SiO_2$ layer deposited on said silicon wafer;

applying a positive photoresist layer onto said $SiO_2$ layer;

implanting ions by focused ion beam implantation into a region of said silicon wafer through said photoresist layer and said $SiO_2$ layer, thereby forming an exposed portion of said photoresist layer directly over said region and an unexposed region of said photoresist layer;

removing only said exposed portion of said photoresist layer to provide a substrate surface including said unexposed region of said photoresist and an uncovered portion of said $SiO_2$ layer directly beneath said removed portion of said photoresist layer;

depositing a gate material over said surface of said substrate so that at least a part thereof is in physical contact with said uncovered portion of said $SiO_2$ layer;

removing said unexposed photoresist layer and any gate material deposited over said unexposed portion of said photoresist layer;

forming a source and a drain on said surface;

metalizing said surface having said source and drain thereon to form metal-oxide-semiconductor device.

2. A method of forming a metal-oxide-semiconductor field effect transistor having a self-aligned gate, comprising the steps of:

forming a substrate comprising a silicon wafer having, an $SiO_2$ layer deposited on said silicon wafer;

depositing a gate material over said $SiO_2$ layer;

applying a negative photoresist layer onto said gate material;

implanting ions by focused ion beam implantation into a region of said silicon wafer through said photoresist layer, said gate layer, and said $SiO_2$ layer, thereby forming an exposed portion of said photoresist layer directly over said region and an unexposed region of said photoresist layer;

removing only said unexposed portion of said photoresist layer to provide a substrate surface including an uncovered portion of said $SiO_2$ layer directly beneath said removed portion of said photoresist layer and a gate material, directly over said region and covered by said exposed portion of said photoresist;

removing said exposed portion of said photoresist to uncover said gate material therebeneath;

forming a source and a drain on said surface;

metalizing said surface having said source and drain thereon to form metal-oxide-semiconductor device.

* * * * *